United States Patent [19]

Würz

[11] Patent Number: 4,789,841
[45] Date of Patent: Dec. 6, 1988

[54] CIRCUIT ARRANGEMENT FOR NOISE REDUCTION AT THE MINIMUM VOLUME SETTING OF AN AMPLIFIER

[75] Inventor: Rainer Würz, Ehringhausen, Fed. Rep. of Germany

[73] Assignee: U.S. Philips Corporation, New York, N.Y.

[21] Appl. No.: 921,710

[22] Filed: Oct. 21, 1986

[30] Foreign Application Priority Data

Oct. 24, 1985 [DE] Fed. Rep. of Germany ....... 3537837

[51] Int. Cl.$^4$ .......................... H03F 1/00; H03F 1/02
[52] U.S. Cl. ........................................ 330/149; 330/9
[58] Field of Search ........................... 330/149, 151, 9; 328/162; 455/222

[56] References Cited

U.S. PATENT DOCUMENTS 4,339,527  9/1985  Ishigaki et al. ..................... 330/149

Primary Examiner—Gene Wan
Attorney, Agent, or Firm—Thomas A. Briody; Algy Tamoshunas; Marianne R. Rich

[57] ABSTRACT

The invention relates to a circuit arrangement for a low-frequency amplifier having volume control, particularly in car radios, for noise reduction when the volume control means (10) is set at minimum. The noise reduction is achieved in that the signal path following the last amplifier stage (23) incorporates an electrically controlled switch (26) by means of which the signal path can be opened when the volume control means (10) is set at minimum.

7 Claims, 1 Drawing Sheet

CIRCUIT ARRANGEMENT FOR NOISE REDUCTION AT THE MINIMUM VOLUME SETTING OF AN AMPLIFIER

BACKGROUND OF THE INVENTION

The invention relates to a circuit arrangement for noise reduction at the minimum volume setting of a low-frequency amplifier which includes a switching circuit for varying the volume dependent on a direct control voltage which can be varied by a volume control means.

In low-frequency amplifiers a disturbing intrinsic noise of the amplifier often occurs in the case of minimum volume setting. The intrinsic noise is particularly strong when an active integrated switching circuit for setting the volume and the tone is used whose intrinsic noise becomes particularly audible in a disturbing manner in the case of minimum volume setting of the amplifier.

Circuit arrangements for low-frequency amplifiers are known in which the volume control is carried out at several points in the amplifier. The volume control means used in the circuit arrangement has several potentiometers which are connected into several stages of the amplifier. In such circuit arrangements the amplifier must additionally be designed for multi-stage volume control and this required relatively many cable connections between the potentiometers and the amplifier. The construction of the circuit is thus relatively complicated and eliminates the advantages of the very simple circuit construction of an active integrated switching circuit for volume control.

A receiver for high-frequency magnetic oscillations using gain control and a monitoring circuit is known from DE-OS No. 24 60 602 in which a control voltage is obtained in the automatic gain control circuit in order to control a switching amplifier connected to a switch-off device arranged in the path of the output signal. The output signal of the receiver is thus muted when the reception level comes below a given value. A corresponding control voltage of an automatic gain control is used as a criterion for the value of the reception level. This circuit is thus used to mute the output when the input signal of the RF receiver becomes too weak. Similar circuits are also known in other embodiments and are generally referred to as muting circuits.

SUMMARY OF THE INVENTION

It is an object of the invention to provide a possibly simple circuit arrangement for a low-frequency amplifier which effectively reduces the intrinsic noise of the amplifier at the minimum volume setting.

According to the invention this object is achieved by incorporating in the signal path of the amplifier coupled to the output of its last stage an electrically controlled switch for opening the signal path dependent on a direct control voltage of a volume control means, the electrically controlled switch opening the signal path at the value of the direct control voltage which is available when the volume is set at minimum by the volume control means.

In this way it is ensured that in the case of minimum volume setting no intrinsic noise of the amplifier occurs in the loudspeaker connected to the output of the amplifier. The switching voltage for the electrically controlled switch may be obtained in several manners. For example, a switch closing a contact in the case of minimum volume setting may be provided on the volume control means so that the signal path is opened or interrupted by means of the electrically controlled switch. An effective reduction of the noise in the case of minimum volume setting is of particular significance when the amplifier is followed by a further non-controlled amplifier for increasing the maximum output power, a so-called booster, because it has also its full amplification in the case of minimum volume setting of the first amplifier and thus makes the intrinsic noise of the first amplifier clearly audible. In addition switch-on and switch-off clicks are effectively suppressed because the signal path is already interrupted when the volume control means has been set to a minimum.

Particularly in car radios an active integrated switching circuit is often used for the purpose of simplifying the circuit and for economising on space for volume, balance and tone controls. The volume is set by means of a direct voltage applied to an input of the integrated switching circuit, which voltage can vary the amplification of the integrated switching circuit, for example between −70 dB and 0 dB. The signal path of the amplifier can then be opened by the electrically controlled switch dependent on this direct control voltage applied to the integrated switching circuit for the purpose of volume setting.

According to a further embodiment of the invention this can be realized by comparing the direct control voltage in a comparator having a given reference voltage and in opening the signal path by means of the electrically controlled switch if the direct control voltage is less than the reference voltage.

If the circuit arragement is provided in a car radio having a circuit for suppressing noise from adjacent transmitters in its receiver section, a further embodiment according to the invention is characterized in that the signal path is opened by means of the electrically controlled switch in response to the circuit for suppressing noise. In this manner the circuit for suppression of noise from adjacent transmitters does not require its own means for opening the signal path, but the electrically controlled switch following the last amplifier stage can switch accordingly for the purpose of suppressing the noise from adjacent transmitters.

According to a further embodiment of the invention an active component, for example, a transistor may be arranged as an electrically controlled switch for the purpose of noise reduction. Due to the use of one or more active components for noise reduction, switching on and switching off can be effected smoothly, so that the switch-on and switch-off transitions are acoustically not disturbing, particularly in the case of additional use of the circuit for suppressing noise from adjacent transmitters.

BRIEF DESCRIPTION OF THE DRAWINGS

An embodiment of the invention will be described in greater detail with reference to the drawings.

DESCRIPTION OF THE PREFERRED EMBODIMENTS

Figure 1:
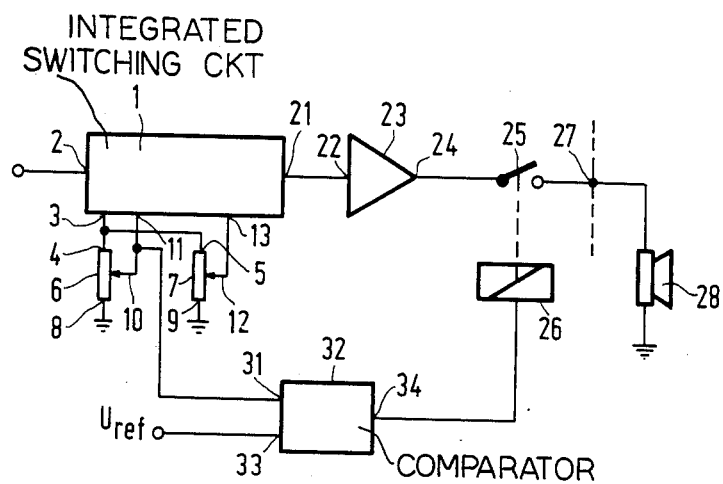
FIG. 1 shows the block-schematic diagram of a car radio low-frequency amplifier having a relay for noise reduction.

The amplifier of a car radio shown in FIG. 1 has an active integrated switching circuit 1 controlling the volume, balance and tone of the amplifier. The low-frequency signal to be influenced is applied from the preceding amplifier stages to the input 2 of the integrated switching circuit 1. The integrated switching circuit 1 has an output 3 supplying a stabilised direct reference voltage. This reference voltage is applied to taps 4 and 5 on two potentiometers 6 and 7. The two other taps 8 and 9 on the potentiometers 6 and 7 are connected to ground. A wiper 10 on potentiometer 6 is connected to an input 11 of the integrated switching circuit 1. Dependent on the position of the wiper 10 on the potentiometer 6 a more or less large direct voltage is applied to this input 11. Dependent on this direct voltage the amplification of the low-frequency signal applied to its input 2 is varied in the integrated switching circuit. A wiper 12 on the second potentiometer 7 is connected to a further input 13 of the integrated switching circuit 1. Dependent on the position of the wiper on the potentiometer 7 this input 13 also receives a variable direct voltage by means of which the low-frequency signal, for example, its frequency response can be influenced in the integrated switching circuit. Generally, four potentiometers will be provided which are arranged in the same way as potentiometers 6 and 7 and serve for setting volume, balance, bass and treble.

The low-frequency signal thus influenced or varied in its level is present at an output 21 of the integrated switching circuit 1 from which it is applied to an input 22 of an amplifier stage 23. An output 24 of the amplifier stage 23 is connected via a relay contact 25 of a relay 26 to a loudspeaker connection 27 of the amplifier. For acoustic reproduction of the low-frequency signals, the loudspeaker 28 is connected to the loudspeaker connection 27.

For the purpose of noise reduction at minimum volume setting by the volume control means 6, the direct control voltage present at the wiper connection 10 of the potentiometer 6, which is applied to the input 11 of the integrated switching circuit for setting the volume of the low-frequency amplifier, is also applied to a first input 31 of a comparator 32. A direct reference voltage is applied to a second input 33 of the comparator 32. The comparator 32 compares the voltages applied to its inputs 31 and 33 and each time supplies a switching voltage at its output 34 when the control voltage applied to its input 31, which is derived from the wiper 10 of the potentiometer 6, is less than the reference voltage applied to its input 33. The switching voltage at the output 34 of the comparator 32 is applied to the relay 26 to cause contact 25 to open the signal path of the amplifier between the amplifier stage 23 and the loudspeaker connection 27.

The reference voltage applied to the input 33 of the comparator 32 is chosen in such a way that the relay 26 opens the signal path when the potentiometer 6 is set to its minimum volume. The reference voltage may, however, also be externally or internally controllable so that the position of the potentiometer 10 at which the signal path is opened by means of the relay 26 is adjustable, for example, dependent on the loudspeaker efficiency or in the case of further following amplifier stages.

Figure 2:
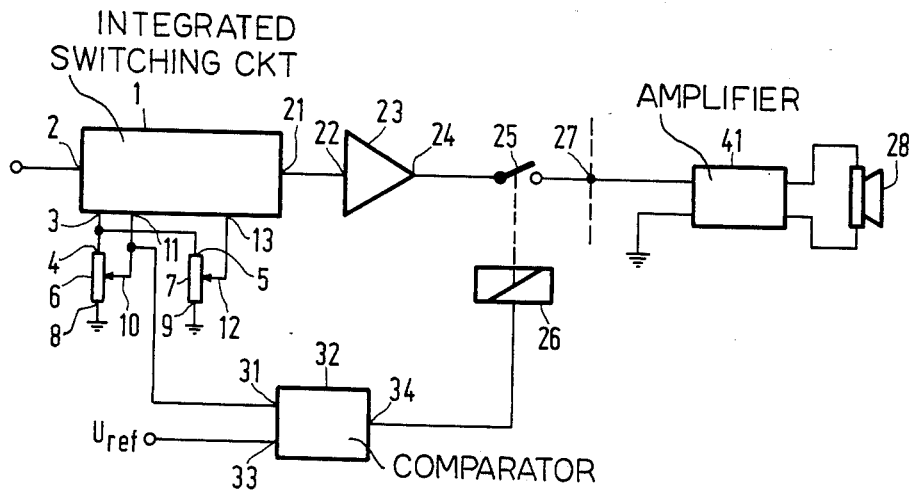
FIG. 2 shows an amplifier according to FIG. 1 with an additional subsequently arranged external amplifier.

In FIG. 2 the circuit arrangement according to FIG. 1 is shown with the addition of an extra amplifier 41 which is arranged between the loudspeaker connection 27 of the low-frequency amplifier and the loudspeaker 28. Such non-controlled additional amplifiers are often arranged following the loudspeaker connections of car radios in order to achieve a higher output power for the loudspeaker. These subsequent amplifiers, so-called boosters, have a continuous full amplification which results in the intrinsic noise of the low-frequency amplifier becoming manifested in a very disturbing manner particularly at the minimum volume setting of the car radio by the volume control means 6 so that in these cases a noise reduction of the car radio amplifier at the minimum volume setting is of particular significance.

What is claimed is:

1. A circuit arrangement for noise reduction at the minimum volume setting of a low-frequency amplifier which includes a switching circuit for varying the volume dependent on a direct control voltage, and a volume control means for varying the direct control voltage, the low-frequency amplifier having a last stage, the circuit arrangement including an electrically controlled switch disposed in a signal path coupled to the output of the last stage for selectively opening the signal path dependent on the direct control voltage, the electrically controlled switch opening the signal path at the direct control voltage value which is available when the volume is set at minimum by the voltage control means.

2. A circuit arrangement as claimed in claim 1, including a comparator which receives the direct control voltage and a given reference voltage and causes the electrically controlled switch to open the signal path when the direct control voltage is less than the reference voltage.

3. A circuit arrangement as claimed in claim 1, wherein the electrically controlled switch is caused to open the signal path when the low-frequency amplifier is switched off.

4. A circuit arrangement as claimed in claim 1, wherein the low-frequency amplifier and the circuit arrangement are in a car radio having a circuit for suppressing noise from adjacent transmitters in its receiver section, the electrically controlled switch being caused to open the signal path in response to the circuit for suppressing noise from adjacent transmitters.

5. A circuit arrangement as claimed in claim 1, wherein the electrically controlled switch is a relay.

6. A circuit arrangement as claimed in claim 1, wherein the electrically controlled switch is an active electronic component such as a transistor.

7. Circuit arrangement for noise reduction in a radio receiver which has a signal path that includes low-frequency amplifier means having an output stage, said circuit arrangement comprising:
   volume control means connected in said signal path for furnishing a control voltage varying in accordance with desired volume;
   and switching means connected to said output stage of said low-frequency amplifier means and connected to said volume control means, for normally maintaining said signal path at said output stage and for interrupting said signal path at said output state in response to a control voltage signifying minimum volume.

* * * * *